United States Patent [19]
Shimoji

[11] Patent Number: 5,408,430
[45] Date of Patent: Apr. 18, 1995

[54] METHOD FOR OPERATING NONVOLATILE MEMORY SEMICONDUCTOR DEVICES MEMORIES

[75] Inventor: Noriyuki Shimoji, Kyoto, Japan

[73] Assignee: ROHM Co., Ltd., Kyoto, Japan

[21] Appl. No.: 54,940

[22] Filed: Apr. 30, 1993

[30] Foreign Application Priority Data

Apr. 30, 1992 [JP] Japan .................................. 4-110913

[51] Int. Cl.⁶ ............................................. G11C 16/04
[52] U.S. Cl. ..................................... 365/185; 365/218
[58] Field of Search ........... 365/185, 218, 900, 230.03, 365/189.01

[56] References Cited

U.S. PATENT DOCUMENTS 4,377,857  3/1983  Tickle ................................... 365/185
5,047,981  9/1991  Gill et al. .............................. 365/185

Primary Examiner—Eugene R. LaRoche
Assistant Examiner—Vu Le
Attorney, Agent, or Firm—Cushman, Darby & Cushman

[57] ABSTRACT

The present invention provides method for erasing a flash memory wherein "overerasing" can be prevented. To erase the cell, a gate voltage of 3 volts is applied to a control gate electrode and a voltage of 15 volts is applied to a source. A drain is left floating. At that time, the accumulated electrons begin to be injected from the floating gate to the source by tunneling. The threshold voltage of the flash memory cell decreases into less than 3 volts in the erasing operation, the potential difference between the floating gate and the source decreases. This enables the amount of charge by F-N tunneling to decrease and the erasing speed to decrease accordingly.

10 Claims, 5 Drawing Sheets

F I G. 5 A
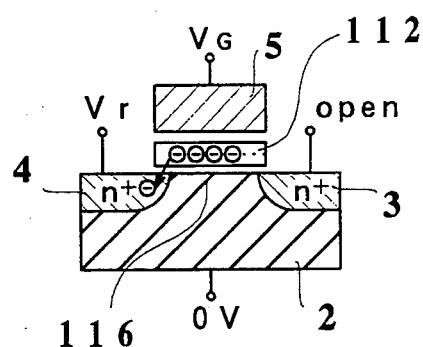
F I G. 5 B
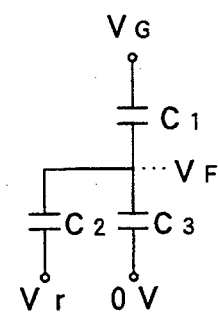
F I G. 5 C
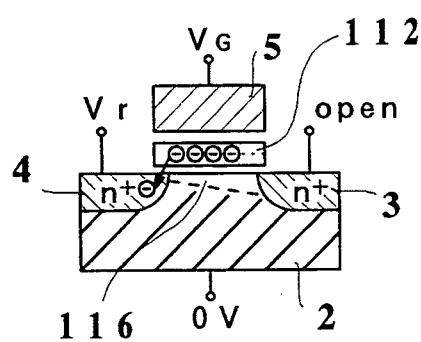
F I G. 5 D
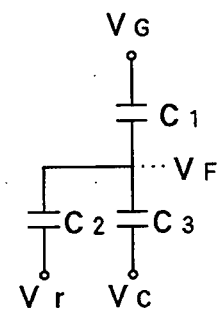

METHOD FOR OPERATING NONVOLATILE MEMORY SEMICONDUCTOR DEVICES MEMORIES

BACKGROUND OF THE INVENTION

1. Field of the Invention

The present invention relates to a semiconductor nonvolatile memory and, more particularly, to an erasing operation where overerasing can be prevented.

2. Description of the Related Art

Nowadays, electrically erasable programmable read only memory ($E^2PROM$) of a flash type (flash memory hereafter) is know as memory where data is able to be rewritten by using electricity. FIG. 1 shows a memory cell 50 of the flash memory in section. The memory cell 50 comprises a substrate having a well 2 in the surface of which an n+ type source 4 and an n+ type drain 3. On the surface of the well 2 is formed a layer 108 of silicon dioxide. On the silicon oxide layer 108, are formed a floating gate 112 of conductive material underlying a layer 113 of silicon dioxide. A control gate electrode 114 is attached to the layer 113. Note that the thickness of the silicon oxide layer 108 is arranged to be 10 nm.

An operation for writing and erasing data into and from the memory cell will be described. To write a logic "1" into the memory cell, a high voltage of about 12 volts is applied to the control gate electrode 114, a voltage of 7 volts is applied to the drain 3 and ground potential is applied to the source 4. At that time, some carriers of hot electrons generated around the drain 3 tunnel the barrier silicon oxide layer 108 and enter into the floating gate 112.

This changes the potential of the floating gate 112 and thereby increases the threshold voltage (TH) of the memory cell 50 into the threshold voltage Vthh. This state means the memory cell 50 is in the logic "1" state.

Meanwhile, to write a logic "0" into the memory cell 50 or to erase the memory cell 50, the charge carriers previously accumulated in the floating gate 112 are injected through the silicon oxide layer 108 into the source 4 by Fowler-Nordheim tunneling. Specifically, a voltage of −12 volts is applied to the floating gate 112 relative to the source 4 in order to generate an electric field of the opposite polarity to that used when writing the logic "".

This changes the potential of the floating gate 112 and thereby decreases the threshold voltage (TH) of the memory cell 50 into the threshold voltage VthL. This state means the memory cell 50 is in the logic "0" state.

As is described above, the memory cell 50 has two threshold voltages (Vthh in the logic "1" state and VthL in the logic "0" state) of different values.

An operation of reading data from the flash memory cell will be described below. In a reading operation, a voltage Vs of "sense voltage" is applied to the control gate electrode 114. Note that "Sense voltage" is a voltage which is between the threshold voltage Vthh and the threshold voltage VthL.

Specifically, since the "sense voltage" Vs is smaller than the threshold voltage Vthh of the flash memory cell 50 with the logic "1" the channel region 116 remains nonconductive. Therefore, no current flows through the channel region 116 when a bias is applied between the source 4 and the drain 3.

Meanwhile, as the "sense voltage" Vs is larger than the threshold voltage VthL of the flash memory cell 50 in logic "0" the channel region 116 changes from nonconductive into conductive. Therefore, a current flows through the channel region 116 when a bias is applied between the source 4 and the drain 3.

As is described above, it can be determined whether the memory cell 50 is in the logic "1" state or the logic "0" state, by determining whether or not a current flows between the drain 3 and the source 4 using the sense voltage Vs applied to the control gate electrode 114.

Meanwhile, as is described above, the erasing operation is effected by injecting charge carriers from the floating gate 112 into the source 4 by Fowler-Nordheim tunneling.

Note that if the time for erasing the memory cell is not controlled, the threshold voltage TH of the memory cell may decrease into the threshold voltage of 0 volt or less becoming what is referred to as "over erased". The flash memory in an "over erasure" state acts as a depletion mode transistor.

When the memory cells are of "over erased" in a flash memory circuit arrayed in rows and columns, the following problem may occur in a reading operation.

FIG. 3 shows a flash memory circuit constructed by using the memory cell 50 in a partial equivalent circuit.

A reading operation will be described below. Specifically, data is read from a flash memory cell C11, which is effected by applying a sense voltage of 3 volts to the word line WL1n, a voltage of 0 volts to the source line SL, a voltage of 2 volts to the bit line BLn connecting with the flash memory cell C11 and connecting a sense amplifier to the bit line BLn.

Since the channel region 116 is nonconductive when the flash memory cell C11 is in the logic "1" state no current flows between the source 4 and the drain 3. Conversely, since the channel region 116 is conductive when the flash memory cell C11 is in the logic "0" state a current flows between the source 4 and the drain 3. The sense amplifier can detect whether a current flows through the bit line BLn.

Assume that the flash memory cell C13 is in an "over erased" state wherein the cell C13 has the threshold voltage VthL of less than 0 volts. Then, since a voltage of 0 volts is applied to the word line WL2n the channel region 116 of the flash memory cell C13 is conductive. Therefore, a current flows through the channel region 116 of the memory cell C13.

There is an extent of charges injected by F-N tunneling because of errors in the coupling rate and the insulating silicon oxide layer 108 due to an extent of the thickness, surface dimensions and positioning. This extent of charges by F-N tunneling make a flash memory cell "over erased".

Specifically, there is a case where the threshold voltage of a flash memory cell decreases into the threshold voltage VthL and at that time the other flash memory cells have a threshold voltage whose magnitude is larger than the threshold voltage VthL. In this case, in order to erase all the flash memory cells, the time to erase the flash memory cell having the slowest erasing speed is necessary because the erasing speed is different in each flash memory cell. Therefore, the threshold voltage of the flash memory cell having the fastest erasing speed decreases into less than the threshold voltage VthL. That means this memory cell will become "over erased".

To prevent "over erased" due to time for erasing, an internal erase verify reference circuit is used. According to an erase algorithm of the erase verify reference circuit, at first, a writing operation is accomplished to increase the threshold voltages of all memory cells into a certain value. The erase verify reference circuit accomplishes an erasing operation of so short a time as not to overerase cells and verifies that the threshold voltage of memory cells is not more than the threshold voltage VthL. The erase algorithm is designed so that if some cells require more time to reach the erased state, the erase and verify sequence will be iterated until all bytes in the array are less than or equal to the threshold voltage VthL.

Meanwhile, it is known that ruggedness between the floating gate 112 and the substrate brings an extent of the charge by F-N tunneling. There is a method for decreasing the extent of charge by F-N tunneling. The more the concentration of phosphorus in the floating gate 112 increases, the more ruggedness between the floating gate 112 and the substrate occurs. Therefore, the extent of charge by F-N tunneling can be decreased by lowering the concentration of phosphorus in the floating gate 112.

Meanwhile, there is a method for preventing "over erased" using hot hole after erase is accomplished in the above-described normal manner. Specifically, after a cell is erased in the above-described normal manner a certain voltage is applied to the control gate electrode 114 of the cell for a certain time. As a result of that, in case the memory cell is "over erased", charge carriers enter into the floating gate 112 of the memory cell while, in case the memory cell requires more time to reach the erased state, holes enter into the floating gate 112. According to the method, the threshold voltage of the memory cell can be fixed at a predetermined value.

However, the above three methods have the following problems. In the method using the erase verify reference circuit, a device using the memory cell is complex and disadvantaged in integration and manufacturing cost.

In the method for lowering the concentration of phosphorus in the floating gate 112, the extent of charge by F-N tunneling due to an error in coupling rate and the insulating silicon oxide layer 108 can not be decreased.

In the method using hot holes, the hot holes deteriorate the insulating silicon oxide layer 108. Furthermore, dissipation power is necessary to generate the hot holes.

SUMMARY OF THE INVENTION

It is an object of the present invention to provide a method for operating a nonvolatile semiconductor memory that has advantages in integration, dissipation power, and controlling an extent of the threshold voltage in an erased state due to an error in coupling rate.

According to one embodiment of the present invention, in a nonvolatile memory cell comprising a first region, a second region which defines a space between the first region and the second region, a first insulating layer spanning the space, a floating electrode spanning the first insulating layer, a second insulating layer spanning the floating electrode, and a control electrode spanning the second insulating layer, a method for changing the nonvolatile memory cell from a field effect transistor with a first threshold voltage into a field effect transistor with a second desired threshold voltage comprises steps of:
 a) applying a returning voltage to the first region,
 b) applying a voltage whose power is larger than that of the second desired threshold voltage of the nonvolatile memory cell, and
 c) leaving the second region floating.

According to another embodiment of the present invention, in a nonvolatile memory cell comprising a first region, a second region which defines a space between the first region and the second region, a first insulating layer spanning the space, a floating electrode spanning the first insulating layer, a second insulating layer spanning the floating electrode, a control electrode spanning the second insulating layer, a first region electrode attached to the first region, and a second region electrode attached to the second region, a method for changing the nonvolatile memory cell from a field effect transistor with a first threshold voltage into a field effect transistor with a second desired threshold voltage comprises steps of:
 a) arraying the nonvolatile memory cells in rows and columns,
 b) connecting each of gate lines to all the control electrodes of the memories arrayed in a row,
 c) connecting each of second region lines to all the second region electrodes of the memories arrayed in a column,
 d) connecting a first region line to the first region electrodes of all the memories arrayed in rows and columns,
 e) applying a returning voltage to the first region,
 f) applying a voltage whose power is larger than that of the second desired threshold voltage of the nonvolatile memory cell, and
 g) leaving the second region floating.

The above, and other objects, features and advantages of the present invention will become apparent from the following description read in conjunction with the accompanying drawings, in which like reference numerals designate the same elements.

BRIEF DESCRIPTION OF THE DRAWINGS

FIGS. 5A through 5D are views for showing a principle of the erasing operation with FIG. 5A showing the memory cell in the beginning of erasing operation, FIG. 5B is a view showing a circuit equivalent to the memory cell of FIG. 5A, FIG. 5C is a view showing the memory cell when the gate voltage Vg is larger than the threshold voltage of the memory cell in an erasing operation, and FIG. 5D is a view showing a circuit equivalent to the memory cell of FIG. 5C.

DETAILED DESCRIPTION OF THE INVENTION

Figure 1:
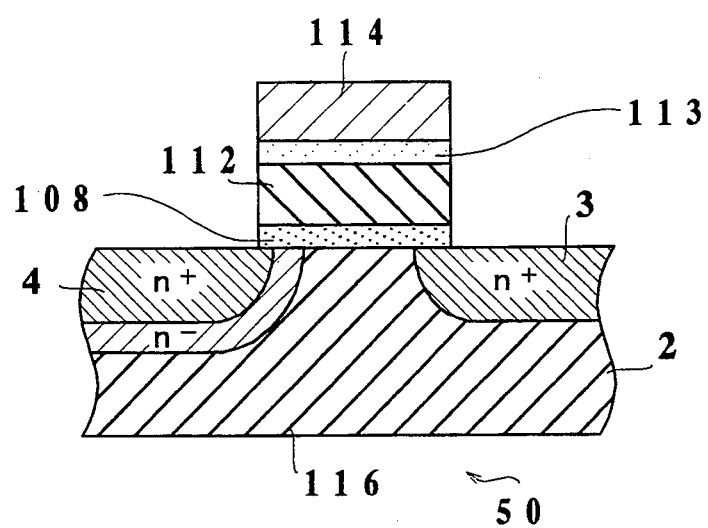
FIG. 1 is a sectional view showing schematically a conventional flash memory cell 50.

A method for erasing a flash memory cell according to an embodiment of the present invention will be described below with reference to FIGS. 5A through 5D. Assume the flash memory cell of FIG. 5A is in a logic "1" state. To erase this memory cell, a gate voltage Vg of 3 volts is applied to a control gate electrode 5 of a control electrode. A voltage of 0 volts is applied to a p type well 2. A returning voltage Vr of 15 volts is applied to a source 4 of a first region. A drain 3 of a second region is left floating. Note in this embodiment that the memory cell with the logic "1" has a first threshold voltage of 4 volts. Furthermore, note that a second desired threshold voltage of the memory cell with a logic "0" where the logic "1" is erased is 1 volts. Furthermore, note that the "returning voltage Vr" and the voltage applied to the control gate electrode 5 can inject charge carriers from a floating gate 112 of a floating electrode into the source 4 by F-N tunneling. Furthermore, note that here is a first insulating layer between the floating gate 112 and the well 2 silicon dioxide and a second insulating layer between the floating gate 112 and that there is the control gate electrode 5.

Referring to FIG. 5B, C1 represents the electric charge capacitance between the control gate electrode 5 and the floating gate 112, C2 represents the electric charge capacitance between the floating gate 112 and the source 4, and C3 represents electric capacity between the floating gate 112 and the well 2. Vf1 represents a potential at which the floating gate 112 is held. When the memory cell is in the logic "1" state, the relationship between the potential Vf1 and the charge capacitors C1, C2 and C3 is shown by:

$$(15-Vf1) \cdot C2 = Vf1 \cdot C3 + (Vf1-3) \cdot C1$$

Therefore, the potential Vf1 is given by:

$$Vf1 = (15 \cdot C2 + 3C1)/(C1+C2+C3) \qquad (1)$$

When the floating gate 112 is held at such a potential relative to the source 4, the accumulated electrons begin to be injected from the floating gate 112 to the source 4. As the accumulated electrons are injected from the floating gate 112 to the source 4, the threshold voltage of the flash memory cell decreases. When the threshold voltage of the flash memory cell reaches 3 volts the channel region 116 becomes conductive because the gate voltage Vg is 3 volts. Furthermore it is known in this case that when the threshold voltage decreases to the gate voltage of less than 3 volts the channel region 116 has a potential of the difference between the gate voltage Vg and the threshold voltage.

Therefore, when in the erasing operation threshold voltage reaches 2 volts the channel region 116 has a potential of 1 volts which is the difference between 3 volts and 2 volts.

Referring to FIG. 5D, when the memory cell reaches the threshold voltage of 2 volts, the relation between a potential Vf2 and charge capacitors C1, C2 and C3 is shown by:

$$(15-Vf2) \cdot C2 = (Vf2-1) \cdot C3 + (Vf2-3) \cdot C1$$

Therefore, the potential Vf2 is given by:

$$Vf2 = (15 \cdot C2 + C3 + 3C1)/(C1+C2+C3) \qquad (2)$$

Referring to equations (1) and (2), the potential Vf2 is larger than the potential Vf1 by $C3/(C1+C2+C3)$ and accordingly a potential difference between the floating gate 112 and the source 4 is smaller than before.

Therefore, the amount of charge by F-N tunneling decreases and accordingly the erasing speed decreases. As the threshold voltage of the flash memory cell decreases into less than 3 volts in the erasing operation, a potential difference between the floating gate 112 and the source 4 decreases. These facts enable the threshold voltage to fixed at a given value. This given value depends on the gate voltage Vg applied to the control gate electrode 5. Therefore, an adjustment in the gate voltage Vg can prevent an "over erased".

Note that the channel region 116 can be held at its own potential because the drain 3 is left floating.

Figure 2:
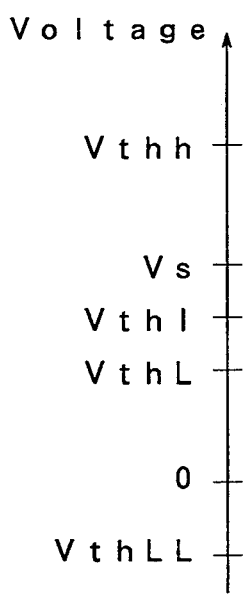
FIG. 2 is a view for showing values of a threshold voltage Vthh of the logic "1" state, a threshold voltage VthL of the logic "0" state, a sense voltage Vs and a threshold voltage VthLL of a "over erased" state.
Figure 3:
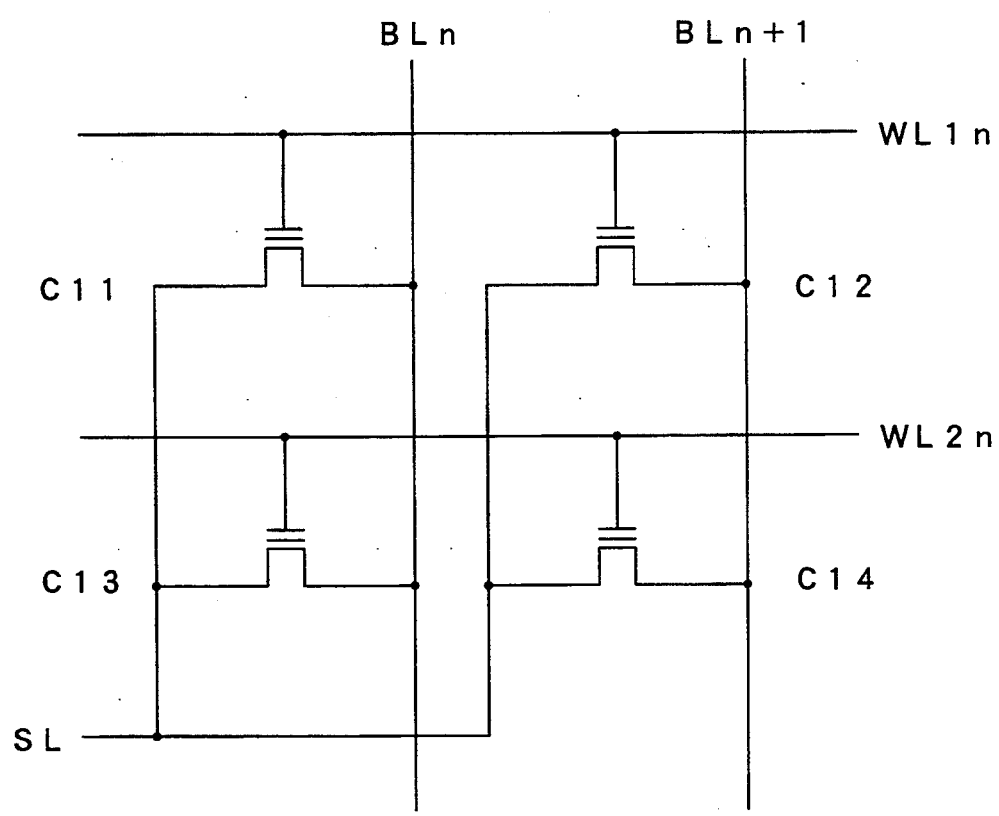
FIG. 3 is a partial equivalent view showing a memory circuit constructed by using the conventional flash memory cell 50.

Note in this embodiment that the gate voltage Vg of 3 volts is larger than a threshold voltage VthI of the flash memory cell in an initial state where a programming voltage has never been applied to the flash memory cell (see FIG. 2). Therefore, the above erasing method can fix the threshold voltages of flash memory cells in the initial state at the same given value of more than 0 volts. That is, "over erased" can be prevented.

Meanwhile, according to the above-described erasing method, an "over erased" can be prevented even when there are errors in the coupling rate and the first insulating layer due to an extent of the thickness, surface dimensions and positioning.

Figure 4A:
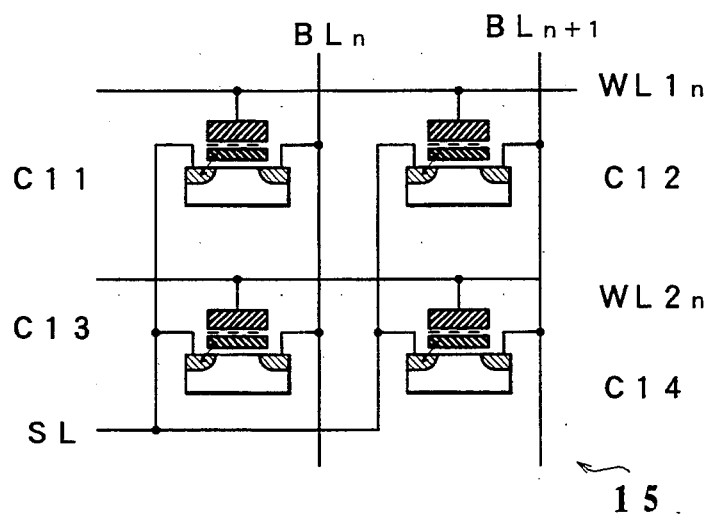
FIG. 4A is a partial equivalent view showing a memory circuit in the beginning of an erasing operation and FIG. 4B is a partial equivalent view showing a memory circuit in a state where only the erasing speed of the memory cell C14 is slower than that of the memory cell C11, C12 and C13.
Figure 4B:
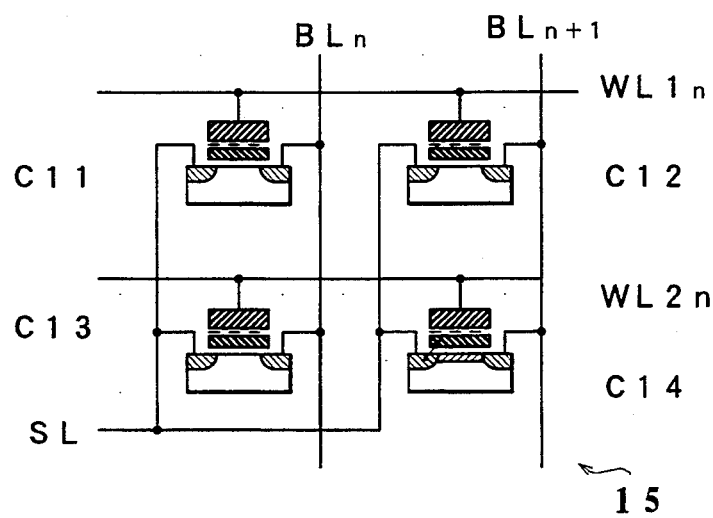

FIGS. 4A and 4B show a memory circuit constructed by using the flash memory cell.

To erase all the memory cells at the same time, a gate voltage of 3 volts is applied to word lines WL1n, WL2n of gate lines and a voltage of 15 volts is applied to a source line SL of a first region line. Bit lines BLn, BLn+1 are left floating. At that time, the accumulated electrons begin to be injected from the floating gate 112 to the source 4 by F-N tunneling. Referring to FIG. 4A, there will be described a case where the memory cell C14 is faster in erasing speed than the memory cells C11, C12 and C13.

In this case, the threshold voltage of the memory cell C14 reaches 3 volts the fastest. At that time, the memory cells C11, C12 and C13 are at the threshold voltage of 3.5 volts. The channel region 116 of the memory cell C14 begins to have a potential difference of that which exists between the threshold voltage and the gate voltage. As erasing operation continues, the threshold voltage of the memory cell C14 is fixed at a predetermined value of more than 0 volts. Eventually, the other memory cells C11, C12 and C13 will be fixed at substantially the same predetermined value.

As is described above, even when each memory cells has a different erasing speed due to errors in the coupling rate, the first insulating layer threshold voltages of all memory cells are allowed to be fixed at a certain value. Therefore, in the matrix memory circuit, "over erased" can be prevented.

Although the second insulating layer of the memory cell 50 of the described embodiment is described as consisting of a silicon dioxide layer 113, it can also consist of a silicon dioxide layer, a silicon nitride layer on the silicon dioxide layer, and a second silicon dioxide layer on the silicon nitride layer.

A method is therefore provided for erasing a memory cell with the logic "1" according to an embodiment of the present invention by a step of applying a voltage whose power is larger than that of the second desired threshold voltage of the memory cell and a step of leaving the second region floating. The present invention provides a nonvolatile semiconductor memory that has advantages in integration, dissipation power, less deterioration of the first insulating layer and which controls the extent of the threshold voltage in an erased state due to an error in a coupling rate and the first insulating layer.

A method is also provided for erasing a memory cell with the logic "1" according to another embodiment of the present invention when memory cells are arrayed in rows and columns, the methods comprising a step of applying a voltage whose power is larger than that of the second desired threshold voltage of the memory cell and a step of leaving the second region floating. The present invention provides a nonvolatile semiconductor memory that has advantages in integration, dissipation power, less deterioration of the first insulating layer and which controls extent of the threshold voltage in an erased state due to an error in a coupling rate and the first insulating layer.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. In a nonvolatile memory cell comprising a first region, a second region which defines a space between the first region and the second region, a first insulating layer spanning the space, a floating electrode spanning the first insulating layer, a second insulating layer spanning the floating electrode, and a control electrode spanning the second insulating layer, a method for returning electrons from the floating electrode to the first region to set a desired threshold voltage of the nonvolatile memory cell comprising the steps of:

applying a returning voltage to the first region;
applying a voltage to the control electrode which voltage is larger than that of the desired threshold voltage of the nonvolatile memory cell; and
leaving the second region floating.

2. In a device comprising a plurality of nonvolatile memory cells each comprising a first region, a second region which defines a space between the first region and the second region, a first insulating layer spanning the space, a floating electrode spanning the first insulating layer, a second insulating layer spanning the floating electrode, a control electrode spanning the second insulating layer, a first region electrode attached to the first region, and a second region electrode attached to the second region, a method for returning electrons from the floating electrodes to the first regions to set a desired threshold voltage of the plurality of nonvolatile memory cells comprising the steps of:

arraying a plurality of nonvolatile memory cells into a plurality of rows and a plurality of columns;
connecting one of a plurality of gate lines to the control electrodes of the nonvolatile memory cells arrayed in each of the plurality of rows;
connecting one of a plurality of second region lines to the second region electrodes of the nonvolatile memory cells arrayed in each of the plurality of columns;
connecting a first region line to the first region electrodes of each of the plurality of nonvolatile memory cells;
applying a returning voltage to the first region line;
applying a voltage to each of the plurality of gate lines which voltage is larger than that of the desired threshold voltage of the nonvolatile memory cell; and
leaving the second region lines floating.

3. A method according to claim 1, wherein the first region is a source, the second region is a drain, the first insulating layer is a layer of silicon dioxide, the floating electrode is a floating gate, the second insulating layer is a layer of silicon dioxide, the control electrode is a control gate electrode, the first region electrode is a source electrode and the second region electrode is a drain electrode.

4. A method according to claim 1, wherein the first region is a source, the second region is a drain, the first insulating layer is a layer of silicon dioxide, the floating electrode is a floating gate, the second insulating layer includes a layer of silicon dioxide, a layer of silicon nitride thereon and a layer of silicon dioxide on the silicon nitride layer, the control electrode is a control gate electrode, the first region electrode is a source electrode and the second region electrode is a drain electrode.

5. A method according to claim 2, wherein the first region is a source, the second region is a drain, the first insulating layer is a layer of silicon dioxide, the floating electrode is a floating gate, the second insulating layer is a layer of silicon dioxide, the control electrode is a control gate electrode, the first region electrode is a source electrode, the second region electrode is a drain electrode, the second region lines are bit lines, the first region line is a source line and the gate lines are word lines.

6. A method according to claim 2, wherein the first region is a source, the second region is a drain, the first insulating layer is a layer of silicon dioxide, the floating electrode is a floating gate, the second insulating layer includes a layer of silicon dioxide, a layer of silicon nitride thereon and a layer of silicon dioxide on the silicon nitride layer, the control electrode is a control gate electrode, the first region electrode is a source electrode, the second region electrode is a drain electrode, the second region lines are bit lines, the first region line is a source line and the gate lines are word lines.

7. A method according to claim 1, wherein the nonvolatile memory cell is written to a logic "0" by returning electrons from the floating electrode.

8. A method according to claim 2, wherein the nonvolatile memory cells are written to a logic "0" by returning electrons from the floating electrodes.

9. A method according to claim 1, wherein the voltage applied to the control electrode is about 3 volts.

10. A method according to claim 2, wherein the voltage applied to each of the plurality of gate lines is about 3 volts.

* * * * *